(12) United States Patent
Ribarich

(10) Patent No.: US 7,463,071 B2
(45) Date of Patent: Dec. 9, 2008

(54) LEVEL-SHIFT CIRCUIT UTILIZING A SINGLE LEVEL-SHIFT SWITCH

(75) Inventor: Thomas J. Ribarich, Laguna Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/781,554

(22) Filed: Jul. 23, 2007

(65) Prior Publication Data
US 2008/0049471 A1 Feb. 28, 2008

Related U.S. Application Data

(60) Provisional application No. 60/820,133, filed on Jul. 24, 2006.

(51) Int. Cl.
*H03B 3/00* (2006.01)
*H02H 7/122* (2006.01)

(52) U.S. Cl. .................. 327/110; 327/108; 327/333; 323/282; 363/98; 363/56.02

(58) Field of Classification Search ............... 327/306, 327/333, 108, 110; 363/98, 80, 56.02; 323/282, 323/283
See application file for complete search history.

(56) References Cited

U.S. PATENT DOCUMENTS

| 7,227,763 | B1 * | 6/2007 | Noh et al. ............... 363/56.02 |
| 7,323,825 | B2 * | 1/2008 | Hwang et al. ............. 315/224 |
| 2005/0184714 | A1 * | 8/2005 | Rusu et al. ................ 323/282 |

* cited by examiner

*Primary Examiner*—Dinh T. Le
(74) *Attorney, Agent, or Firm*—Ostrolenk, Faber, Gerb & Soffen, LLP

(57) ABSTRACT

A level-shift circuit for use with a half bridge in accordance with an embodiment of the present application includes an oscillator operable to provide a timing signal, a level-shift switch controlled by the timing signal of the oscillator, a high side control circuit operable to provide a high side control signal to a high side switch of the half bridge to control the high side switch and a low side control circuit operable to provide a low side control signal to a low side switch of the half bridge to control the low side switch. The level-shift switch is turned ON when the timing signal is high such that the level-shift switch connects the high side control circuit to ground and the high side control signal stays low to keep the high side switch OFF when the timing signal is high. The low side control circuit provides the low side control signal to turn the low side switch ON a predetermined period of time after the timing signal goes high.

11 Claims, 2 Drawing Sheets

US 7,463,071 B2

LEVEL-SHIFT CIRCUIT UTILIZING A SINGLE LEVEL-SHIFT SWITCH

The present application claims benefit of and priority to U.S. Provisional Patent Application Ser. No. 60/820,133 entitled HIGH-VOLTAGE LEVEL-SHIFT CIRCUIT USING A SINGLE LEVEL-SHIFT MOSFET dated Jul. 24, 2006, the entire contents of which are hereby incorporated by reference herein.

BACKGROUND OF THE INVENTION

The present invention relates to an improved high-voltage level-shift circuit. More specifically, the present application relates to a high-voltage level-shift circuit utilizing a single level-shift switch, preferably a MOSFET.

It is common for high voltage power converters to use level-shifting to control non-ground referenced power switches. A wide variety of methods are available to perform level-shifting, each of which has its own advantages and drawbacks. Typically, however, the need to provide level-shifting results in a more complex circuit regardless of which specific approach it utilized.

Conventional level-shift techniques commonly use a two pulse "set" and "reset" method. In this approach, two high-voltage level-shift transistors are used for the "set" and "reset" signals for turning the high side gate driver on and off. The "set" and "reset" signals are usually provided through a dv/dt filter and then to an R-S latch for storing the on/off state of the high-side gate driver during the corresponding on or off time. This approach, however, has certain disadvantages. After the "set" or "reset" signal is sent to the high-side circuitry and stored in the latch, there is no guarantee that the state of the of the high-side gate driver is the correct state. The low-side circuitry does not receive any signal to verify the state of the high side gate driver. Thus, it is possible that noise, voltage transients or dv/dt disturbances could occur in the high-side circuit causing the latch to change state which may trigger the high-side gate driver to turn the high side switch on or off at the wrong time. This could result in a catastrophic failure of the power circuit depending on the condition of the load. Further, in a half-bridge application, it is critical that the high-side switch, typically a MOSFET, be OFF when the low side MOSFET is ON in order to prevent a direct short across the DC bus. The pulse method does not guarantee that the high side will stay OFF when the low side is ON, and thus, faults may occur.

Accordingly, it would be beneficial to provide a level-shift circuit that avoids the problems identified above.

SUMMARY OF THE INVENTION

It is an object of the present invention to provide an improved level-shift circuit that utilizes a single level-shift switch and eliminates the latch that stores the on/off status of the high side switch to reduce complexity and component count.

A level-shift circuit for use with a half bridge in accordance with an embodiment of the present application includes an oscillator operable to provide a timing signal, a level-shift switch controlled by the timing signal of the oscillator, a high side control circuit operable to provide a high side control signal to a high side switch of the half bridge to control the high side switch and a low side control circuit operable to provide a low side control signal to a low side switch of the half bridge to control the low side switch. The level-shift switch is turned ON when the timing signal is high such that the level-shift switch connects the high side control circuit to ground and the high side control signal stays low to keep the high side switch OFF when the timing signal is high. The low side control circuit provides the low side control signal to turn the low side switch ON a predetermined period of time after the timing signal goes high.

Other features and advantages of the present invention will become apparent from the following description of the invention which refers to the accompanying drawings.

BRIEF DESCRIPTION OF THE DRAWING(S)

DETAILED DESCRIPTION OF PREFERRED EMBODIMENTS OF THE INVENTION

Figure 1:
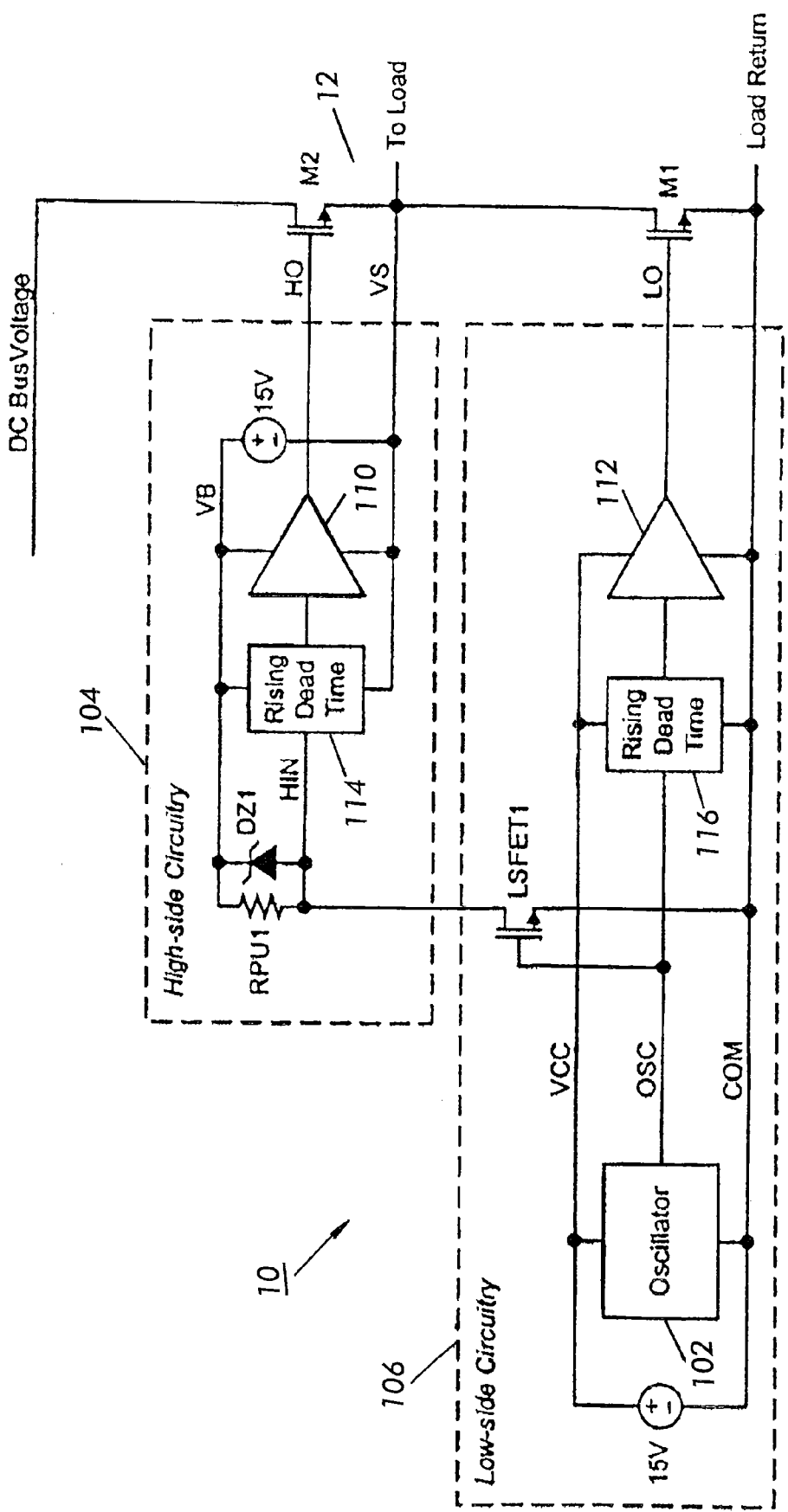
FIG. 1 illustrates a schematic diagram of a level-shift circuit in accordance with an embodiment of the present invention.

FIG. 1 illustrates a schematic diagram of a level-shift circuit 10 in accordance with an embodiment of the present application. In FIG. 1, a half-bridge 12 is provided with a high side MOSFET M2 (high side switch) and a low side MOSFET M1 (low side switch) connected across a DC bus and used to provide power to a load (not shown). While the switches M1, M2 are referenced herein as metal-oxide-semiconductor field-effect transistors (MOSFETs), it is noted that any suitable switches may be used, for example, insulated gate bipolar transistors (IGBT's). The high side control circuit 104 provides a high side control signal HO used to control the high side MOSFET M2 while low side control circuit 106 provides a low side control signal LO which is used to control the low side MOSFET M1. The level-shift circuit 10 and half- bridge 12 are preferably a part of a voltage converter device or circuit that may be utilized to provide power to the desired load. Specifically, a voltage at the node A between the high side and low side MOSFETs M2, M1 is preferably provided to the load.

An oscillator 102 is preferably provided to generate a timing signal OSC that sets the frequency and duty cycle of the high side and low side gate drivers, 110, 112 included in the high side control circuit 104 and low side control circuit 106, respectively. The gate drivers 110, 112 provide the control signals HO, LO that control the MOSFETs M2, M1, respectively. A level-shift MOSFET LSFET1 is provided to shift the ground referenced high side on/off control signal up to the level of the floating high-side gate driver 110 via the resistor RPU1. A high side dead time circuit 114 is provided to set the dead-time, that is, the time between the turning OFF of the low side MOSFET M1 and turning ON of the high side MOSFET M2.

A low side dead time circuit 116 is connected to the low side gate driver 112 in the low side control circuit 106 to set the dead time, that is, the delay between the turning OFF of the high side switch M2 and turning ON of the low side switch M. The low side gate driver 112 provides the output control signal LO to the low side1 MOSFET M1 to turn it ON and OFF. The low side gate driver 112 receives the output timing signal OSC from the oscillator 102 as an input.

Figure 2:
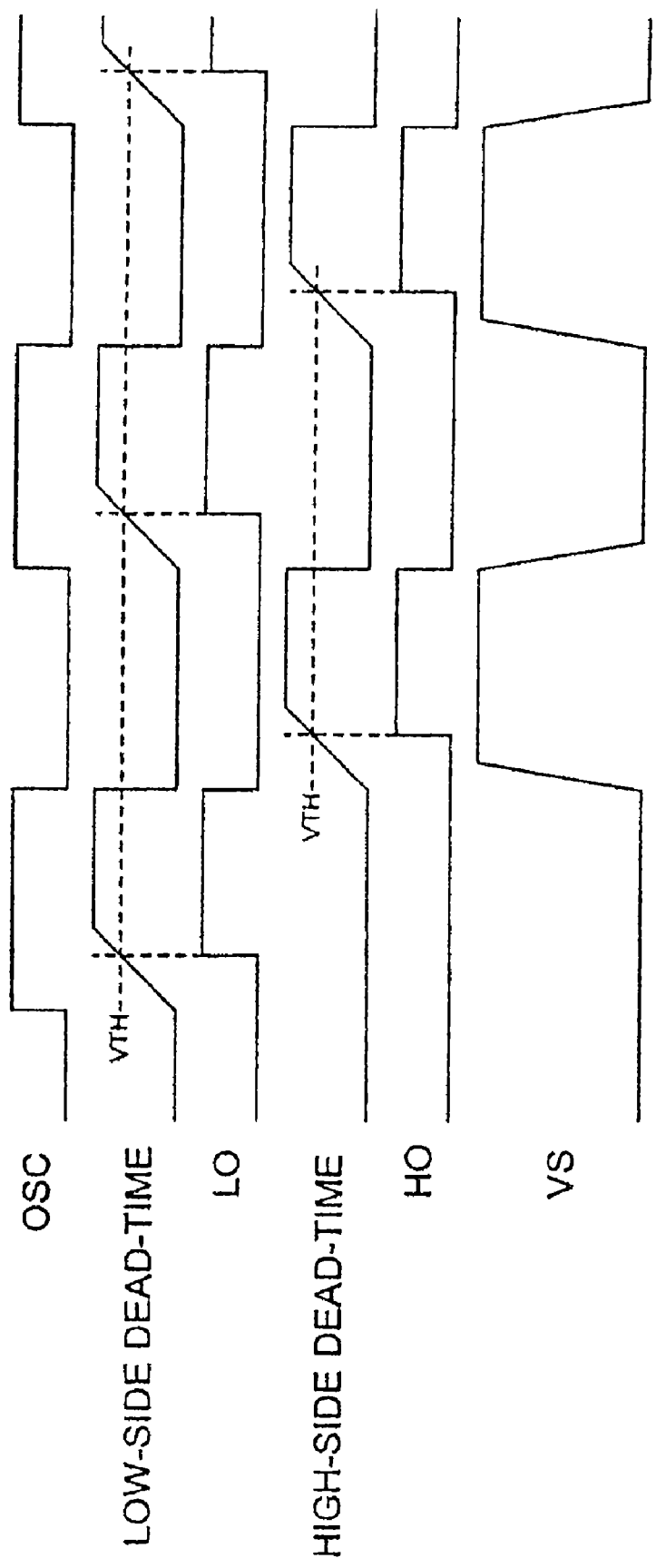
FIG. 2 is a graph illustrating exemplary waveforms of the level-shift circuit of FIG. 1.

The oscillator 102 is preferably a standard rising and falling ramp generator that produces the timing signal OSC for setting the frequency and duty-cycle of the high and low side gate drivers 110, 112. FIG. 2 illustrates an exemplary waveform of the output signal OSC provided by the oscillator 102. When the output OSC of the oscillator 102 goes "high", the gate of the level-shift MOSFET LSFET1 turns ON causing the drain thereof to be pulled to ground such that the high side gate drive control signal HO goes low and stays low to turn the high side switch M2 OFF. The signal OSC is also provided to the low side dead time circuit 116 to initiate the start of the dead time delay between the high side MOSFET M2 turning OFF and the low side MOSFET M1 turning ON. The low side dead time circuit 116 preferably includes a standard ramp circuit that begins ramping up only after the rising edge of the timing signal OSC as can be seen in FIG. 2 for example. After the low side dead time circuit 116 ramps up to a threshold VTH, the low side dead time circuit times out, and the LO signal goes high to turn the low side MOSFET M1 ON. The high value of the timing signal OSC keeps the level shift switch LSFET1 ON, and thus, the high side gate driver 110 OFF to ensure that the high side control signal HO stays low to keep the high side MOSFET M2 OFF.

When the signal OSC goes low, the end of the ON time for the low side switch M1 is indicated. The low side dead time circuit 116 discharges via the common return line COM and the low side control signal LO goes low to turn the switch M1 OFF. Further, the low value of the timing signal OSC turns the level-shift MOSFET LSFET1 OFF such that the drain (node HIN) of the MOSFET LSFET1 is pulled up to the supply voltage provided at node VB through the pull up resistor RPU1. Further, the node HIN is provided as an input to the high side dead time circuit 114 to initiate the start of the dead time delay between the control signal LO going low, that is, the switch M1 turning OFF, and the control signal HO going high, that is, the switch M2 turning ON. The high side dead time circuit 114 preferably includes a standard ramp that begins ramping only at the rising edge of the input signal at node HIN. After the ramp reaches the threshold (VTH), the high side dead time circuit 114 times out and the control signal HO goes high to turn the switch M2 ON. The low value of OSC at the same time holds the control signal LO low to ensure that the low side switch M1 does not go on.

While the switch M2 is ON, the ground VS of the floating high side control circuit 104 is connected to the high voltage DC bus rail through the high side power switch M2 and the high side supply VB is typically at 15 V above VS. When the output of the oscillator OSC goes "high" again, the end of the high side on-time is triggered. The gate of LSFET1 goes high causing the drain of the LSFET1 to be pulled toward ground again to a fixed voltage level below VB, which is set by the zener diode ZD1. As a result, a low is provided at the node HIN that results in the high side dead-time circuit 114 discharging to the high side ground VS, the high side control signal HO going low, and the high side power switch M2 turning OFF. The high value of the timing signal OSC at the output of the oscillator 102 causes the low side dead time circuit 116 to ramp up again (to set the dead time, or delay, between HO turning switch M2 OFF, and LO turning switch M1 ON) and the cycle repeats.

Since the half- bridge 12 is of a totem pole type and the dead time is a fixed amount, the power loss and resulting rise in temperature in the level-shift MOSFET LSFET1 is minimized to an acceptable level. The power loss and resulting temperature rise only occurs during the dead time period which is short when compared to the entire switching period. High voltage and a fixed current (which is set by resistor RPU1) occur together at the MOSFET LSFET1 as the VS voltage slews from the DC bus voltage to COM, or from COM to the DC bus voltage. The half bridge power switches M1, M2 guarantee that at all other times the VS node is either at the DC bus voltage (when M2 is ON and M1 is OFF) or at ground (when M1 is ON and M2 is OFF) so that no losses occur across LSFET 1 at these times.

Thus, the level-shifting circuit 10 of the present application allows for the use of a single high voltage MOSFET (LSFET1) for level-shifting and eliminates the need for a latch to store the state of the high side gate driver. Further, the circuit 10 combines high side dv/dt filter and high side dead-time functionality into the single high side dead time circuit 114. The circuit 10 prevents false turn-on of the high side switch and results in minimum and acceptable power losses at the level-shift MOSFET since the losses only occur during the relatively short dead time. At the same time, the circuit 10 is less complex than conventional level-shift circuits since it eliminates several components that are required in other circuits.

FIG. 2 illustrates certain waveforms of the circuit of FIG. 1. As can be seen in FIG. 2, when the timing signal OSC goes high, the ramp signal of the low side dead time circuit 116 starts to increase. When it reaches the threshold voltage VTH, the low side control signal LO goes high to turn the low side switch M1, for example, ON. At the same time, the high side control signal HO stays low to keep the high side switch M2, for example, OFF. When the oscillator signal OSC goes low, the low-side control signal drops low to shut the low side switch OFF. Similarly, the low side dead time circuit discharges such that the dead time signal goes low as well. The high side dead time signal starts to rise until it reaches the threshold VTH. After this, the high side control signal HO goes high to turn the high side switch ON. When the timing signal OSC goes high again, the high side control signal HO goes low to turn the high side switch OFF. The high side dead time circuit discharges and the low side dead time signal begins to ramp up again to start the process over. This cycle then repeats as necessary. Further, as can be seen in FIG. 2, and as noted above, the ground VS of the high side control circuit 104 changes quickly between the high voltage DC rail of the DC bus and ground, thus limiting losses incurred by the level-shift switch.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A level-shift circuit for use in a voltage conversion circuit utilizing a half bridge comprises:
   an oscillator operable to provide a timing signal;
   a level-shift switch controlled by the timing signal of the oscillator;
   a high side control circuit operable to provide a high side control signal to a high side switch of the half bridge to control the high side switch; and
   a low side control circuit operable to provide a low side control signal to a low side switch of the half bridge to control the low side switch; wherein
   the level-shift switch is turned ON when the timing signal is high such that the level-shift switch connects the high side control circuit to ground and the high side control signal stays low to keep the high side switch OFF when the timing signal is high; and wherein
   the low side control circuit provides the low side control signal to turn the low side switch ON a predetermined period of time after the timing signal goes high.

2. The level-shift circuit of claim 1, wherein the low side control circuit further comprises:

a low side driver circuit operable to generate the low side control signal; and a low side dead time circuit operable to provide a low side dead time signal to the low side driver circuit to delay an ON time of the low side switch indicated by the low side control signal for the predetermined period of time.

3. The level-shift circuit of claim 2, wherein the low side dead time signal is a ramp signal and wherein the ON time of the low side switch indicated by the low side control signal is delayed until the low side dead time ramp signal reaches a predetermined threshold level.

4. The level-shift circuit of claim 3, wherein the high side control circuit further comprises:

a high side driver circuit operable to generate the high side control signal; and a high side dead time circuit operable to provide a high side dead time signal to the high side driver circuit to delay an ON time of the high side switch indicated by the high side control signal when the timing signal goes low, wherein the ON time of the high side switch is delayed for the predetermined period of time after the high timing signal goes low.

5. The level-shift circuit of claim 4, wherein the high side dead time signal is a second ramp signal and wherein the ON time of the high side switch indicated by the high side control signal is delayed until the high side dead time ramp signal reaches the predetermined threshold level.

6. The level-shift circuit of claim 5, wherein an input voltage at an input of the high side dead time circuit is pulled to ground when the level-shift switch is ON such that the input voltage to the high side dead time circuit remains at least a fixed amount lower than a supply voltage of the high side control circuit to ensure that the high side control signal keeps the high side switch OFF while the level-shift switch is ON.

7. The level-shifting circuit of claim 6, further comprising a diode connected between the input of the high side dead time circuit and the supply voltage of the high side control circuit, wherein the diode sets the fixed amount that the input voltage stays below the supply voltage.

8. The level-shift circuit to claim 7, further comprising a pull up resistor connected between the input to the high side dead time circuit and the supply voltage and in parallel with the diode, such that when the level-shift switch is OFF, the input voltage at the high side dead time circuit is pulled up to the supply voltage via the pull up resistor, such that the high side control signal will go high to turn the high side switch ON after the predetermined period of time.

9. The level-shift circuit of claim 8, wherein the low side switch, the high side switch and the level-shift switch are implemented as metal-oxide-semiconductor field-effect transistors.

10. The level-shift circuit of claim 8, wherein the low side switch, the high side switch and the level-shift switch are implemented as insulated gate bipolar transistors.

11. The level-shift circuit of claim 9, wherein an output voltage is provided at a node between the high side switch and the low side switch and is provided to a load, and wherein the high side and low side switches are turned on and off based on the high side control signal and low side control signal, respectively, to control the output voltage.

* * * * *